United States Patent
Falster

(10) Patent No.: US 7,008,874 B2
(45) Date of Patent: Mar. 7, 2006

(54) PROCESS FOR RECLAIMING SEMICONDUCTOR WAFERS AND RECLAIMED WAFERS

(75) Inventor: Robert J. Falster, London (GB)

(73) Assignee: MEMC Electronics Materials, Inc., St. Peters, MO (US)

( * ) Notice: Subject to any disclaimer, the term of this patent is extended or adjusted under 35 U.S.C. 154(b) by 628 days.

(21) Appl. No.: 10/022,967

(22) Filed: Dec. 13, 2001

(65) Prior Publication Data

US 2002/0086539 A1   Jul. 4, 2002

Related U.S. Application Data

(60) Provisional application No. 60/256,783, filed on Dec. 19, 2000.

(51) Int. Cl.
*H01L 21/302* (2006.01)

(52) U.S. Cl. .................... 438/692; 438/694; 438/691

(58) Field of Classification Search ................ 257/618, 257/347, 913, 619; 156/636.1, 645.1; 216/88, 216/89; 117/3, 15, 20, 201, 932; 428/64.1, 428/446; 423/348; 438/691, 692, 694, 705
See application file for complete search history.

(56) References Cited

U.S. PATENT DOCUMENTS

2002/0086539 A1 * 7/2002 Falster ....................... 438/692

* cited by examiner

*Primary Examiner*—Laura M. Schillinger
(74) *Attorney, Agent, or Firm*—Senniger Powers

(57) ABSTRACT

The present invention is directed to a process for reclaiming for reuse a single crystal silicon wafer removed from an aborted semiconductor device fabrication process. The process includes (a) subjecting the wafer to an oxide growth step to form an oxide layer having a thickness greater than 2 nanometers, (b) thinning the wafer by removing material from substantially the entire front surface to provide a thinned wafer having a thinned precipitate free zone, and (c) polishing the front surface of the thinned wafer to a specular finish.

27 Claims, 2 Drawing Sheets

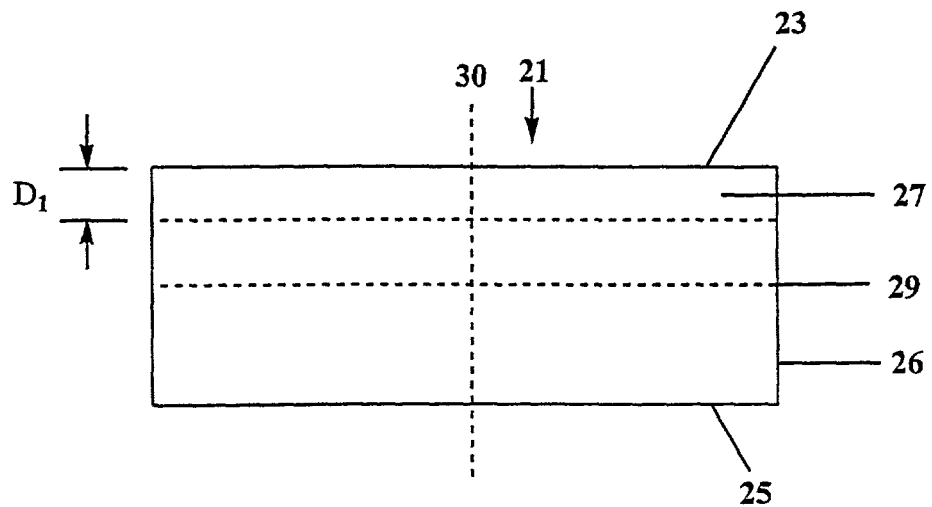
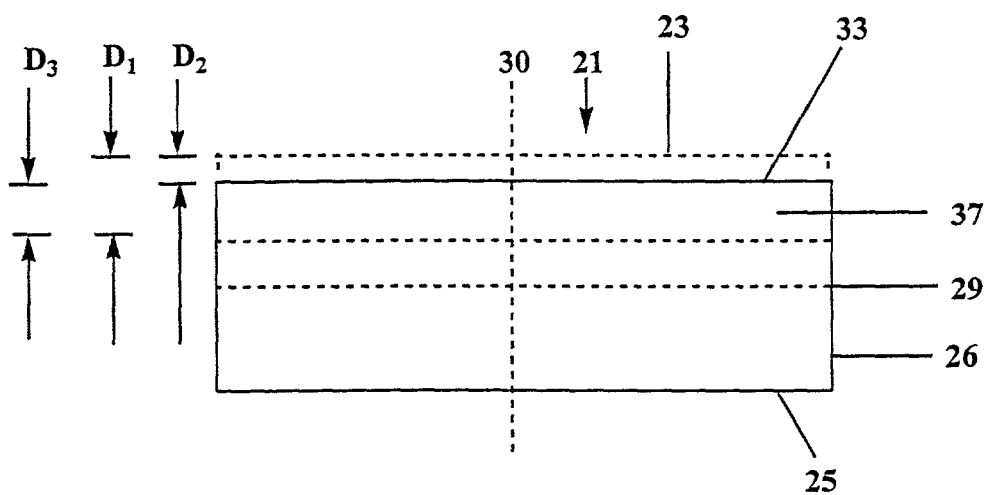

PROCESS FOR RECLAIMING SEMICONDUCTOR WAFERS AND RECLAIMED WAFERS

CROSS-REFERENCE TO RELATED APPLICATION

This application claims priority from U.S. Provisional Application Ser. No. 60/256,783 filed on Dec. 19, 2000.

BACKGROUND OF THE INVENTION

The present invention generally relates to a process for the reclamation and reuse of semiconductor material substrates, especially silicon wafers, in the manufacture of electronic components.

During the course of the manufacture of integrated circuits and other semiconductor devices, batches of silicon wafers are occasionally improperly processed. For example, a batch of silicon wafers may be given an improper ion-implantation step or incorrectly processed photolithographically. As a result, these wafers in their then current state are no longer suitable for the manufacture of semiconductor devices. Rather than simply disposing of these batches of wafers, it has been proposed that they be reclaimed for reuse in the semiconductor device manufacturing process.

Reclaiming a silicon wafer for reuse generally requires the removal of any layers which may have been deposited on the wafer surface as well as a portion of the original wafer, typically several to a few tens of micrometers of the wafer. Typically, these layers are removed by chemical-mechanical polishing of the surface(s).

Because of the uncertainty that reclaimed wafers are equivalent to virgin "prime" wafers and are suitable for use as a substrate in the manufacture of semiconductor devices, reclaimed wafers have generally been restricted to use as mechanical "dummy" or monitor wafers. A primary concern is the presence of oxygen precipitates in what will become the device layer of such re-claimed wafers.

Thermal treatment cycles typically employed in the fabrication of electronic devices can cause the precipitation of oxygen in silicon wafers which are supersaturated in oxygen. Depending upon their location in the wafer, the precipitates can be harmful or beneficial. Oxygen precipitates located in the active device region of the wafer can impair the operation of the device. It is required, therefore, that the wafer contain an oxygen precipitate free zone (or "denuded zone") of a predetermined depth in the near-surface region of the wafer with the actual depth required for a given application depending upon the design of the device. Oxygen precipitates located in the bulk of the wafer, however, are capable of trapping undesired metal impurities that may come into contact with the wafer. The use of oxygen precipitates located in the bulk of the wafer to trap metals is commonly referred to as internal or intrinsic gettering ("IG"). For many applications, therefore, it is preferred that the wafer contain oxygen precipitates in the wafer bulk, that is, the region of the wafer outside the device layer.

Historically, electronic device fabrication processes included a series of steps which were designed to produce a precipitate free zone with the balance of the wafer, i.e., the wafer bulk, containing a sufficient number of oxygen precipitates for IG purposes. Denuded zones have conventionally been formed, for example, in a high-low-high thermal sequence such as (a) oxygen out-diffusion heat treatment at a high temperature (>1100° C.) in an inert ambient for a period of at least about 4 hours, (b) oxygen precipitate nuclei formation at a low temperature (600–750° C.), and (c) growth of oxygen ($SiO_2$) precipitates at a high temperature (1000–1150° C.). See, e.g., F. Shimura, *Semiconductor Silicon Crystal Technology*, Academic Press, Inc., San Diego Calif. (1989) at pages 361–367 and the references cited therein.

More recently, advanced electronic device manufacturing processes such as DRAM manufacturing processes have begun to minimize the use of high temperature process steps. As a result, there is a certain, often considerable, amount of variability in the distribution of oxygen precipitates which develop in wafers subjected to a defined integrated circuit manufacturing process. This variability, combined with the fact that reclaimed wafers may be obtained from any arbitrary point in the semiconductor device manufacturing process has been, at least in part, responsible for restricting reclaimed wafers to monitor wafer uses; as noted above, the semiconductor device manufacturing process requires that the wafers reliably have a oxygen precipitate free zone of adequate depth and, to date, reclaimed wafers could not be expected to reliably provide a precipitate free zone in what will become the device layer.

SUMMARY OF THE INVENTION

Among the objects of the invention, therefore, is the provision of a process for reclaiming semiconductor wafers which provides wafers having a precipitate free zone of a known and predictable depth, the provision of such a process which enables wafers to be reclaimed for use as prime wafers, and the provision of such reclaimed wafers.

Briefly, therefore, the present invention is directed to a process for reclaiming for reuse a single crystal silicon wafer removed from an aborted semiconductor device fabrication process. The process comprises: (a) subjecting the wafer to an oxide growth step to form an oxide layer having a thickness greater than 2 nanometers, (b) thinning the wafer by removing material from substantially the entire front surface to provide a thinned wafer having a thinned precipitate free zone, and (c) polishing the front surface of the thinned wafer to a specular finish.

The present invention is further directed to a process for reclaiming for reuse a silicon comprising: (a) growing an oxide layer having a thickness of at least 2 nanometers on the front surface thereof, (b) thinning the wafer by removing material from substantially the entire front surface to provide a thinned wafer having a thinned precipitate free zone, wherein said thinning is designed to provide a thinned precipitate free zone having a thickness of at least 5 micrometers, and (c) polishing the front surface of the thinned wafer to a specular finish.

The present invention is further directed to a process for reclaiming for reuse a silicon wafer having two major, generally parallel surfaces, one being the front surface of the wafer and the other being the back surface of the wafer, a circumferential edge joining the front and back surfaces, a central axis, a radius extending from the central axis to the circumferential edge of at least about 75 mm, a central plane approximately equidistant between the front and back surfaces, and a non-uniform distribution of crystal lattice vacancies with the maximum concentration of vacancies being at a distance, D, from the front surface. The process comprises thinning the wafer by removing material from the front surface to provide a thinned wafer, the amount of material removed from the front surface being insufficient to reach said distance, D, and polishing the front surface of the thinned wafer to a specular finish.

Other objects and features of this invention will be in part apparent and in part pointed out hereinafter.

BRIEF DESCRIPTION OF THE DRAWINGS

FIG. 2 is a schematic depiction of a starting wafer for the process of the present invention.

FIG. 3 is a schematic depiction of a reclaimed wafer of the present invention.

DETAILED DESCRIPTION OF THE PREFERRED EMBODIMENTS

Figure 1:
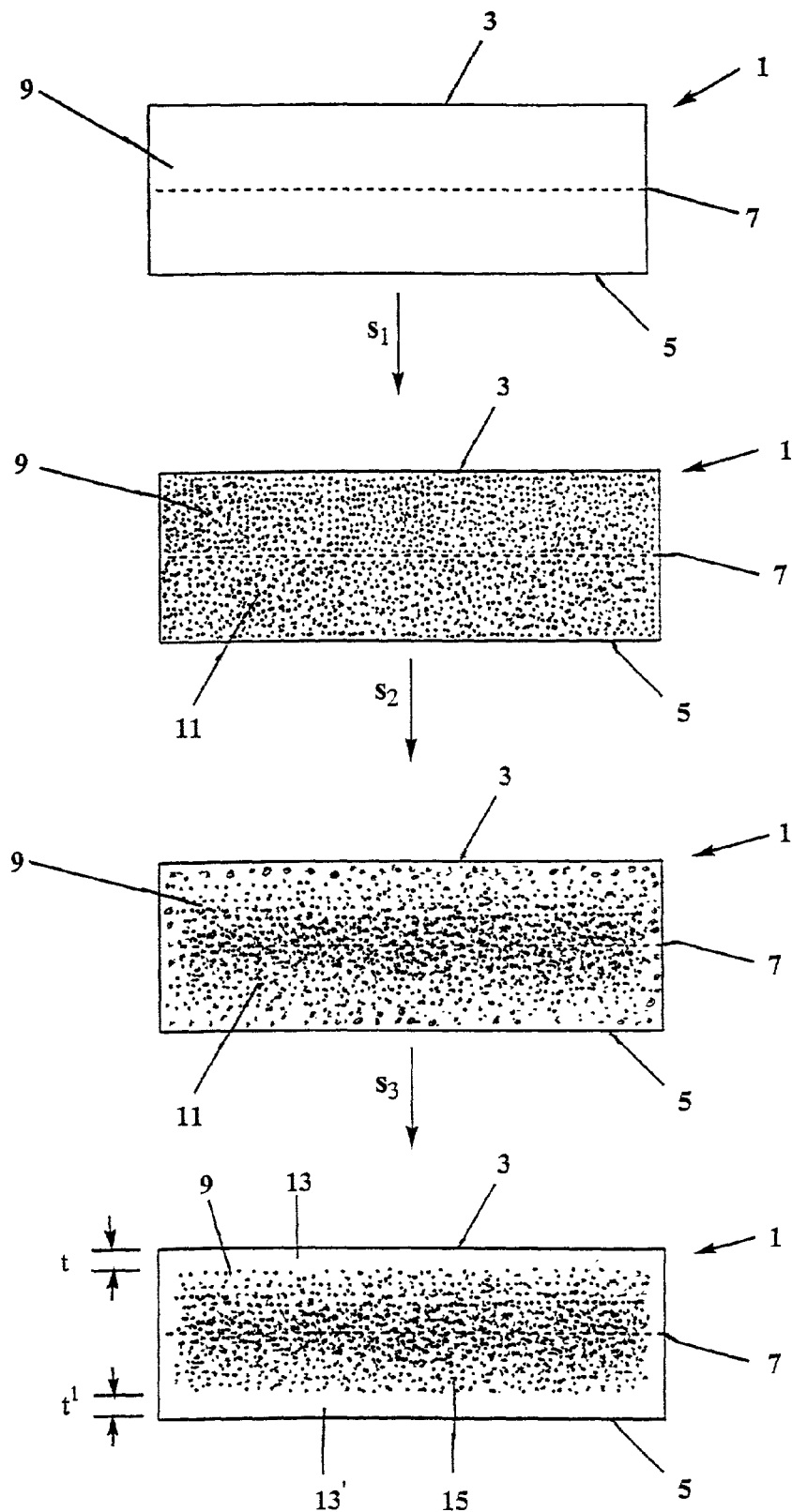
FIG. 1 is a schematic depiction of a prior art process for the preparation of an ideal precipitating wafer.

Silicon wafers used as a starting material for semiconductor device fabrication typically have a naturally occurring oxide layer, sometimes referred to as a native oxide layer, having a thickness on the order of about 2 nanometers or less. One of the early steps, if not the first step, in a conventional semiconductor device fabrication process is the growth of a silicon oxide layer on the surface of a thickness which is substantially in excess of native oxide layer. For example, a silicon oxide layer may be grown to a thickness of at least 3 nanometers, typically at least 25 nanometers, and often to a thickness of at least 50 nanometers. Thereafter, various layers are deposited or doped in patterns to form semiconductor devices in a device layer of the wafer.

Processing errors may occur at any step during the semiconductor device fabrication process. Consequently, wafers removed from the semiconductor device manufacturing process at any of these various points in the process will contain various layers and patterns. In common, however, they typically share at least one common characteristic: they have been subjected to an oxide growth step to form an oxide layer having a thickness which is greater than a native oxide layer, that is, a thickness of at least 2 nanometers, typically at least 3 nanometers, more typically at least 25 nanometers, and often at least 50 nanometers.

Candidate Wafers for Reclamation

A wafer removed from a semiconductor device manufacturing process is a candidate for reclamation in accordance with the process of the present invention if it contains an oxygen precipitate free zone of a known and predictable depth. As used herein, precipitate free zones are zones which have (i) an absence of oxygen precipitates in excess of the current detection limit (currently about $10^7$ oxygen precipitates/cm$^3$) and (ii) a low concentration of, and preferably an essential absence of oxygen precipitation centers which, upon being subjected to an oxygen precipitation heat-treatment, are converted to oxygen precipitates. The presence (or density) of oxygen precipitate nucleation centers cannot be directly measured using presently available techniques. They may be indirectly measured, however, if they are stabilized and oxygen precipitates are grown at these sites by subjecting the silicon to an oxygen precipitation heat treatment. As used herein, therefore, silicon having a low density of oxygen precipitate nucleation centers shall mean silicon which, upon being annealed at a temperature of 800° C. for four hours and then at a temperature of 1000° C. for sixteen hours, has less than about $10^8$ oxygen precipitates/cm$^3$. Similarly, silicon having an essential absence of oxygen precipitate nucleation centers shall mean silicon which, upon being annealed at a temperature of 800° C. for four hours and then at a temperature of 1000° C. for sixteen hours, has less than $10^7$ oxygen precipitates/cm$^3$.

In one embodiment, the reclaimed semiconductor wafer has a precipitate free zone throughout the wafer. In another embodiment, the reclaimed semiconductor wafer has a precipitate free zone in the near-surface region of the wafer but not the wafer bulk; in this embodiment, the precipitate free zone predictably extends to a depth of at least 20 micrometers, more preferably at least about 30 micrometers, still more preferably at least about 40 micrometers, still more preferably at least about 50 micrometers, and for many applications, preferably at least about 60 or more micrometers.

In addition to a precipitate free zone of a known and predictable depth, candidate wafers for use in accordance with the present invention may optionally contain an axially symmetric region which is substantially free of agglomerated, intrinsic point defects resulting from an agglomeration of crystal lattice vacancies or silicon self-interstitials. In general, silicon containing an axially symmetric region which is substantially free of agglomerated, intrinsic point defects may be prepared by (i) growing the single crystal silicon in accordance with the Czochralski method, (ii) controlling the growth velocity, v, and the average axial temperature gradient, $G_0$, during the growth of the constant diameter portion of the crystal over the temperature range from solidification to a temperature of no less than about 1325° C., and (iii) controlling the cooling rate of the crystal from the solidification temperature to about 1,050° C. to cause the formation of an axially symmetrical segment which is substantially free of agglomerated intrinsic point defects. In one embodiment, the axially symmetric region contains silicon self-interstitial atoms as the predominant intrinsic point defect and the region extends inwardly from the lateral surface of the ingot and has a width as measured from the lateral surface radially inward to the central axis of the ingot which is at least about three-tenths the length of the radius of the ingot, and has a length as measured along the central axis of at least about two-tenths the length of the constant diameter portion of the ingot. See, for example, U.S. Pat. Nos. 6,254,672 and 6,287,380 which are incorporated herein by reference in their entirety. In another embodiment, the axially symmetric region contains crystal lattice vacancies as the predominant intrinsic point defect and the region extends radially outwardly from the central axis of the ingot and has a width as measured from the central axis radially outward to the lateral surface of the ingot which is at least about 15 mm, and has a length as measured along the central axis of at least about two-tenths the length of the constant diameter portion of the ingot. See, for example, U.S. Pat. No. 5,919,302 which is incorporated herein by reference in its entirety.

In addition, to having a precipitate free zone of a known and predictable depth, and optionally having an axially symmetric region which is substantially free of agglomerated intrinsic point defects as described above, candidate wafers for use in accordance with the present invention may optionally contain an epitaxial layer deposited on the surface thereof. See for example, U.S. Pat. No. 6,236,104 and Provisional U.S. Patent Application No. 60/285,180 which are incorporated herein by reference in their entirety.

a. Precipitate Free Zone throughout the Wafer

In one embodiment of the present invention, a candidate wafer for reclamation has a precipitate free zone throughout the wafer. Such wafers may be prepared, for example, from (i) silicon grown under conditions which avoid the formation of oxygen precipitate nucleation centers, (ii) silicon which has been thermally annealed to dissolve any existing oxygen precipitate nucleation centers, or (iii) low oxygen content silicon.

Oxygen precipitate nucleation centers typically form in silicon which is annealed at a temperature in the range of about 350° to about 750° C. In one embodiment, therefore, the candidate wafers may be single crystal silicon wafers taken from "short" crystals, that is, silicon which has been grown in a Czochralski process until the seed end has cooled from the melting point of silicon (1410° C.) to about 750° C. after which the ingot is rapidly cooled. In this way, the time spent in the temperature range critical for nucleation center formation is kept to a minimum and the nucleation centers have inadequate time to form in the crystal puller.

Alternatively, and more preferably, wafers having an essential absence of oxygen precipitate nucleation centers throughout the wafer may be prepared by annealing the wafers to dissolve any oxygen precipitate nucleation centers formed during the growth of the single crystal. Provided they have not been subjected to a stabilizing heat-treatment, oxygen precipitate nucleation centers can be annealed out of silicon by rapidly heating the silicon to a temperature of at least about 875° C. and preferably continuing to increase the temperature to at least 1000° C. By the time the silicon reaches 1000° C., substantially all (e.g., >99%) of such defects have annealed out. It is important that the wafers be rapidly heated to these temperatures, i.e., that the rate of temperature increase be at least about 10° C. per minute and more preferably at least about 50° C. per minute. Otherwise, some or all of the oxygen precipitate nucleation centers may be stabilized by the heat-treatment. Equilibrium appears to be reached in relatively short periods of time, i.e., on the order of 1 minute. Accordingly, oxygen precipitate nucleation centers in the single crystal silicon starting material may be dissolved by annealing the silicon at a temperature of at least about 875° C. for a period of at least about 30 seconds, preferably at least about 10 minutes. The dissolution may be carried out in a conventional furnace or in a rapid thermal annealing (RTA) system. In addition, the dissolution may carried out on crystal ingots or on wafers.

Although less preferred, wafers having an essential absence of oxygen precipitate nucleation centers throughout the wafer may be prepared from low oxygen content single crystal silicon, that is, silicon having an oxygen content of less than 10 parts per million atomic ("PPMA"), and preferably less than 9 PPMA, as determined in accordance with ASTM standard F-121-83). Low oxygen content single crystal silicon may be prepared using a variety of processes such as float-zone or Czochralski techniques, but preferably magnetic Czochralski techniques. Most preferably, low oxygen content silicon is prepared using Czochralski crystal pulling method in the presence of a transverse magnetic field (MCZ) as described, for example, in U.S. Pat. No. 5,418,172 and in F. Shimura, *Semiconductor Silicon Crystal Technology*, Academic Press, 1989.

b. Precipitate Free Zone in the Near-surface Region but not in the Wafer Bulk

In a preferred embodiment of the present invention, a candidate wafer for reclamation has a low density of, and preferably, an essential absence of oxygen precipitate nucleation centers in the near-surface region of the wafer but oxygen precipitate nucleation centers in the wafer bulk. Such wafers, sometimes referred to as "ideal precipitating wafers," are commercially available from MEMC Electronic Materials, Inc. (St. Peters, Mo.) under the trademarks MAGIC DENUDED ZONE and MDZ and may be prepared as described in U.S. Pat. No. 5,994,761, which is incorporated herein by reference in its entirety.

Referring now to FIG. 1, the starting material for an ideal precipitating wafer is a single crystal silicon wafer 1, having a front surface 3, a back surface 5, an imaginary central plane 7 between the front and back surfaces, and a wafer bulk 9 comprising the wafer volume between front surface 3 and back surface 5. The terms "front" and "back" in this context are used to distinguish the two major, generally planar surfaces of the wafer; the front surface of the wafer as that term is used herein is not necessarily the surface onto which an electronic device will subsequently be fabricated nor is the back surface of the wafer, as that term is used herein, necessarily the major surface of the wafer which is opposite the surface onto which the electronic device is fabricated. In addition, because silicon wafers typically have some total thickness variation, warp and bow, the midpoint between every point on the front surface and every point on the back surface may not precisely fall within a plane; as a practical matter, however, the TTV, warp and bow are typically so slight that to a close approximation the midpoints can be said to fall within an imaginary central plane which is approximately equidistant between the front and back surfaces.

In step $S_1$, silicon wafer 1 is subjected to a heat-treatment step in which the wafers are heated to an elevated temperature in a non-oxidizing atmosphere to form and thereby increase the number density of crystal lattice vacancies 11 in bulk 9. Preferably, this heat-treatment step is carried out in a rapid thermal annealer in which the wafers are rapidly heated to a target temperature and annealed at that temperature for a relatively short period of time. In general, the wafer is subjected to a temperature in excess of 1175° C., more preferably at least about 1200° C., and most preferably between about 1200° C. and 1275° C. The wafer will generally be maintained at this temperature for at least one second, typically for at least several seconds (e.g., at least 3) or even several tens of seconds and, depending upon the desired characteristics of the wafer and the atmosphere in which the wafer is being annealed, for a period which may range up to about 60 seconds (which is near the limit for commercially available rapid thermal annealers).

Upon completion of the rapid thermal annealing step, the wafer, in step $S_2$, is rapidly cooled through the range of temperatures at which crystal lattice vacancies are relatively mobile in the single crystal silicon. As the temperature of the wafer is decreased through this range of temperatures, some vacancies recombine with silicon self-interstitial atoms and others diffuse to the front surface 3 and back surface 5, thus leading to a change in the vacancy concentration profile 11 with the extent of change depending upon the length of time the wafer is maintained at a temperature within this range. If the wafer were slowly cooled, the vacancy concentration would once again become substantially uniform throughout wafer bulk 9 with the concentration being an equilibrium value which is substantially less than the concentration of crystal lattice vacancies immediately upon completion of the heat treatment step. By rapidly cooling the wafer, however, a non-uniform distribution of crystal lattice vacancies can be achieved with the maximum vacancy concentration being at a distance of at least 20 micrometers, at least about 30 micrometers, at least about 40 micrometers, at least about 50 micrometers or more. In general, the average cooling rate within this range of temperatures is at least about 5° C. per second, preferably at least about 20° C. per second, more preferably at least about 50° C. per second, still more preferably at least about 100° C. per second, with cooling rates in the range of about 100° C. to about 200° C. per second being presently most preferred. Once the wafer is cooled to a temperature outside the range of temperatures at which crystal lattice vacancies are relatively mobile in the single crystal silicon, the cooling rate does not appear to significantly influence the precipitating characteristics of the wafer and thus, does not appear to be narrowly critical.

The rapid thermal annealing and cooling steps may be carried out in any of a number of commercially available rapid thermal annealing ("RTA") furnaces in which wafers are individually heated by banks of high power lamps. RTA furnaces are capable of rapidly heating a silicon wafer, e.g., they are capable of heating a wafer from room temperature to 1200° C. in a few seconds. One such commercially available RTA furnace is the model 610 furnace available from AG Associates (Mountain View, Calif.). The atmosphere during the rapid thermal annealing and cooling steps is generally any non-oxidizing atmosphere; oxidation of the silicon surface has been found to suppress the vacancy concentration during the rapid thermal annealing step. Preferably, therefore, the atmosphere has a total absence of oxygen or a partial pressure of oxygen which is insufficient to inject sufficient quantities of silicon self-interstitial atoms which suppress the build-up of vacancy concentrations. While the lower limit of oxygen concentration at which the vacancy concentration is unacceptably suppressed has not been precisely determined, it is generally preferred that the atmosphere during the rapid thermal annealing step have less than 2,000 ppm (0.002 atm.) and more preferably less than about 1,000 ppm (0.001 atm.) of oxygen. The atmosphere may be, for example, a nitriding atmosphere such as nitrogen or ammonia, a non-nitriding atmosphere such as helium, neon, carbon dioxide or argon, or combinations thereof. Preferably, it is argon.

When argon and other non-nitriding atmospheres are used as the atmosphere in the heating (rapid thermal annealing) step, the increase in vacancy concentration throughout the wafer is achieved nearly, if not immediately, upon achieving the annealing temperature. Maintaining the wafer at an established temperature for additional time does not appear, based upon experimental evidence obtained to-date, to lead to an increase in vacancy concentration. This behavior is different from what has been observed when a nitriding atmosphere is used; in nitriding atmospheres, vacancy concentration appears to increase as a function of time at an established annealing temperature.

Also, when argon and other non-nitriding atmospheres are used, the profile of the resulting vacancy concentration (number density) formed during the rapid thermal annealing step is substantially uniform in the wafer bulk. After the rapid cooling step, $S_2$, (See FIG. 1), the maximum vacancy concentration is at or near central plane 7 and the vacancy concentration generally decreases in the direction of the front surface 3 and back surface 5 of the wafer. In contrast, when a nitriding atmosphere is used, the resulting vacancy concentration (number density) profile formed during the rapid thermal annealing step may be "U-shaped;" that is, the concentration of vacancies will be at a maximum at or near the front and back surfaces and at a minimum at or near the central plane when a nitriding atmosphere is used. After the rapid cooling step, $S_2$, (See FIG. 1), the maximum vacancy concentration is at a distance of at least 20 micrometers, preferably at least about 30 micrometers, more preferably at least about 40 micrometers, and still more preferably at least about 50 micrometers from the front surface with the vacancy concentration decreasing from this point in the direction of the central plane and in the direction of the front surface.

After the wafer has been cooled, it is ready for use in an electronic device manufacturing process. As one of the first steps of such processes, wafers are typically loaded into a furnace which is at a temperature of about 800° C. When loaded into a furnace at this temperature, the previously cooled wafer will have separate zones which behave differently with respect to oxygen precipitation. In the high vacancy concentration regions, oxygen clusters rapidly as the wafer enters the furnace. By the time the loading temperature is reached, the clustering process is finished and a distribution of clusters is reached which depends only upon the initial concentration of vacancies. In the low vacancy concentration regions, i.e., the relatively near surface regions, the wafer behaves like a normal wafer which lacks pre-existing oxygen precipitate nucleation centers; that is, oxygen clustering is not observed. As the temperature is increased above 800° C. or if the temperature remains constant, the clusters in the vacancy rich zone grow into precipitates and are thereby consumed whereas in the vacancy lean zone, nothing happens. By dividing the wafer into various zones of vacancy concentration, a template is effectively created through which is written an oxygen precipitate pattern which is fixed the moment the wafer is loaded into the furnace.

After an oxygen precipitation heat-treatment step, $S_3$, in which the wafer is annealed at a temperature of about 800° C. for about four hours and then at a temperature of about 1000° C. for about sixteen hours in an oxygen containing atmosphere, the resulting depth distribution of oxygen precipitates in the wafer is characterized by clear regions of oxygen precipitate-free material (precipitate free zones or "denuded zones") 13 and 13' extending from the front surface 3 and back surface 5 to a depth t, $t^1$, respectively. Between these oxygen precipitate-free regions, is a precipitation zone 15 containing a substantially uniform density of oxygen precipitates. In general, the density of precipitates will be greater than $10^8$ precipitates/cm$^3$ and less than $10^{11}$ precipitates/cm$^3$, with $5 \times 10^9$ precipitates/cm$^3$ being typical.

The depth t, $t^1$ from the front and back surfaces, respectively, of oxygen precipitate-free material (denuded) zones 13 and 13' is primarily a function of the cooling rate through the temperature range at which crystal lattice vacancies are relatively mobile in silicon. In general, the depth t, $t^1$ decreases with decreasing cooling rates with denuded zone depths of at least about 20, 30, 40, 50, 70 or even 100 micrometers being attainable. Significantly, the depth of the denuded zone is essentially independent of the details of the electronic device manufacturing process and, in addition, does not depend upon the out-diffusion of oxygen as is conventionally practiced. While the heat treatments employed in this process may result in the out-diffusion of a small amount of oxygen from the surface of the front and back surfaces of the wafer, the wafer bulk at depths of at least 5 micrometers from the wafer surface will have a substantially uniform oxygen concentration. Nevertheless, a denuded zone of substantially greater depth can be formed as a consequence of the cooling step which caused the formation of a non-uniform distribution of crystal lattice vacancies in the wafer.

Unlike other methods used to form denuded zones, it is unnecessary to subject the single crystal silicon to a high temperature step to cause the outdiffusion of oxygen in regions near the surface of the silicon. Such high temperature steps when carried out for the sole purpose of forming a denuded zone add significant cost to the silicon wafer. Thus, the wafer of the present invention will have a denuded zone and a substantially uniform oxygen concentration as a function of depth from the silicon surface. For example, the wafer will have a uniform concentration of oxygen from the center of the wafer to regions of the wafer which are within about 15 micrometers of the silicon surface, more preferably from the center of the silicon to regions of the wafer which are within about 10 micrometers of the silicon surface, even more preferably from the center of the silicon to regions of the wafer which are within about 5 micrometers of the silicon surface and most preferably from the center of the silicon to regions of the wafer which are within 3 micrometers of the silicon surface. In this context, substantially uniform oxygen concentration shall mean a variance in the oxygen concentration of no more than about 50%, preferably no more than about 20% and most preferably no more than about 10%.

If an epitaxial layer is to be deposited upon the ideal precipitating wafer, the ideal precipitating heat treatment process described above may be carried out either before or after the epitaxial deposition. If carried out before, it may be desirable to stabilize the oxygen precipitate nucleation centers in the wafer after the process of the present invention and before the epitaxial deposition. See for example, U.S. Pat. No. 6,306,733 and Provisional U.S. Patent Application No. 60/285,180 which are incorporated herein in their entirety. If carried out after, it may be desirable to carry out the ideal precipitating heat treatment process in the epitaxial reactor immediately after the epitaxial deposition, provided the cooling rates required by the process of the present invention can be achieved.

Wafer Reclamation Process

Referring now to FIG. 2, wafer 21, removed from an aborted semiconductor device fabrication process and selected as a candidate for reclamation in accordance with the process of the present invention, comprises a front surface 23 which may be patterned or unpatterned, a back surface 25 approximately parallel to the front surface, a circumferential edge 26 joining the front and back surfaces, an imaginary central plane 29 located approximately equidistant between the front and back surfaces, and a central axis 30. Wafer 21 preferably has a nominal diameter of at least about 150 mm (a radius of at least about 75 mm as measured from central axis 30 to circumferential edge 26). In addition, such wafers contain a precipitate free zone 27, which extends to a known and predictable depth $D_1$ as measured from front surface 23 and toward central plane 29. Significantly, $D_1$ is the minimum and not the maximum thickness of the precipitate free zone; that is, the wafer may contain a precipitate free zone from front surface 23, to back surface 25, or the wafer may contain a precipitate free zone 27 to a depth $D_1$ from front surface 23, and oxygen precipitates or oxygen precipitate nucleation centers outside this zone with $D_1$ typically being at least about 20, 30, 40, 50, 60, 70, 80, 90 or even 100 micrometers. Referring now to FIG. 3, material is removed from front surface 23 to (i) eliminate any patterns, structures, layers or impurities introduced into or on front surface layer during the aborted semiconductor device fabrication process and (ii) form a specular finish. Removal of the material to depth $D_2$ as measured from original front surface 23 creates a new front surface 33 having a specular finish and a precipitate free zone 37 having a remaining thickness or depth $D_3$ as measured from new front surface 11.

Material may be removed from front surface 23 by chemical etching or polishing, mechanical grinding, lapping or polishing, chemical-mechanical polishing, or comparable means conventionally known to those skilled in the art for the removal of silicon from the surface of a candidate wafer. More specifically, material is removed substantially uniformly from substantially the entire front surface of the wafer. Preferably, material is removed substantially uniformly as a function of wafer radius to provide a uniformly thinned wafer having substantially no thickness variation, preferably less than +/−10 microns of total thickness variation for a 150 mm or a 200 mm diameter wafer. Preferably, it is removed by chemical-mechanical polishing which may be carried out, for example, using an apparatus and process of the type generally described in U.S. Pat. No. 5,605,487.

In general, semiconductor device layers may be as thin as 2 micrometers in the case of certain horizontal structures or as deep as 15 micrometers in the case of certain vertical structures such as trench capacitors. Thus, at least about 2 to about 15 micrometers of material will typically be removed from the front surface 23 of a candidate wafer. Furthermore, additional material will typically be removed to provide the wafer with a specular finish. In general, about 10 to about 20 micrometers of material removal is typically required to provide a specular surface.

A significant criteria for selecting a candidate wafer from an aborted process for reclamation and reuse as a prime wafer in a semiconductor device fabrication process is that the thickness or depth $D_3$ of the thinned precipitate free zone 37 remaining after material removal exceed the thickness of the device layers formed in the semiconductor device fabrication process for which the reclaimed wafer is being considered as a candidate wafer for reuse. This criteria, in turn, cannot reliably be met unless the wafer from the aborted process has a known and predictable precipitate free zone depth and this depth equals or preferably exceeds the sum of (i) the thickness of the device layer formed in the aborted process, (ii) the amount of material which must be removed to provide a specular finish on the front surface of the wafer after the device layer formed in the aborted process is removed, and (iii) the thickness of the device layer to be formed in the semiconductor device fabrication process for which the reclaimed wafer is a candidate for reuse. In one embodiment of the present invention, therefore, the process of selecting a wafer from an aborted process for reclamation and reuse in a semiconductor device fabrication process comprises the steps of determining whether the minimum thickness of the precipitate free zone (prior to thinning) in the candidate wafer exceeds the sum of (i) the amount of material which must be removed to provide the reclaimed wafer with a specular finish on the front surface of the wafer after any device layer formed in the aborted process is removed, and (ii) the thickness of the device layer to be formed in the semiconductor device fabrication process for which the reclaimed wafer is a candidate for reuse.

Because device layers typically do not exceed 20 micrometers in thickness, it is preferred that the thickness of the precipitate free zone in a candidate wafer after material removal and polishing ($D_3$ in FIG. 3) be at least 20 micrometers, more preferably at least about 30 micrometers, still more preferably at least about 40 micrometers and still more preferably at least about 50 micrometers. Viewed from another perspective, it is generally preferred that the thickness of the precipitate free zone in a candidate wafer prior to material removal and polishing ($D_1$ in FIG. 3) be at least twice the thickness of the precipitate free zone in the candidate wafer after material removal and polishing ($D_3$ in FIG. 3) and that the thickness of the precipitate free zone in the candidate wafer after material removal and polishing ($D_3$ in FIG. 3) be at least 5 micrometers, more preferably at least 10 micrometers, still more preferably at least 15 micrometers, and still more preferably at least 20 micrometers.

If the candidate wafer additionally includes an epitaxial layer, the device layer will be located in the epitaxial layer.

Therefore at least a portion of the epitaxial layer, the entire epitaxial layer, or even the entire epitaxial layer and a portion of the substrate upon which the epitaxial layer is deposited will be removed during the reclamation process of the present invention. In one embodiment of the present invention, the wafer may simply be reused as a polished wafer which does not include an epitaxial layer. In another embodiment, a new epitaxial layer may be deposited on the reclaimed wafer. Similarly, candidate wafers which did not include an epitaxial wafer prior to the reclamation process may have an epitaxial layer deposited on the surface thereof after the reclamation process.

Wafers reclaimed in accordance with the process of the present invention may optionally be used for integrated circuit manufacturing or as a monitor wafer during an integrated circuit manufacturing cycle.

In view of the above, it will be seen that the several objects of the invention are achieved.

As various changes could be made in the above compositions and processes without departing from the scope of the invention, it is intended that all matter contained in the above description be interpreted as illustrative and not in a limiting sense.

I claim:

1. A process for re-use of a silicon wafer having two major, generally parallel surfaces, one being the front surface of the wafer and the other being the back surface of the wafer, a circumferential edge joining the front and back surfaces, a central axis, a radius extending from the central axis to the circumferential edge of at least about 75 mm, a central plane approximately equidistant between the front and back surfaces, and a precipitate free zone having a thickness of at least 20 micrometers adjacent the front surface, the process comprising:
   (a) subjecting the wafer to an oxide growth step to form an oxide layer having a thickness greater than 2 nanometers,
   (b) after step (a), thinning the wafer by removing material from substantially the entire front surface to provide a thinned wafer having a thinned precipitate free zone, and
   (c) polishing the front surface of the thinned wafer to a specular finish.

2. The process of claim 1 wherein the thickness of the thinned and polished wafer is at least about 10 micrometers thinner than the thickness of the wafer prior to the oxide growth step.

3. The process of claim 1 wherein the precipitate free zone, prior to said oxide growth step had a thickness of at least about 30 micrometers.

4. The process of claim 3 wherein the thickness of the thinned and polished wafer is at least about 15 micrometers thinner than the thickness of the wafer prior to the oxide growth step.

5. The process of claim 1 wherein the precipitate free zone, prior to said oxide growth step had a thickness of at least about 50 micrometers.

6. The process of claim 5 wherein the thickness of the thinned and polished wafer is at least about 30 micrometers thinner than the thickness of the wafer prior to the oxide growth step.

7. The process of claim 1 wherein the thickness of the thinned and polished wafer is at least about 15 micrometers thinner than the thickness of the wafer prior to the oxide growth step.

8. The process of claim 1 wherein the thickness of the thinned and polished wafer is at least about 30 micrometers thinner than the thickness of the wafer prior to the oxide growth step.

9. The process of claim 1 wherein the precipitate free zone extends from the front surface to the back surface of the wafer.

10. The process of claim 9 wherein the thickness of the thinned and polished wafer is at least about 10 micrometers thinner than the thickness of the wafer prior to the oxide growth step.

11. The process of claim 9 wherein the thickness of the thinned and polished wafer is at least about 15 micrometers thinner than the thickness of the wafer prior to the oxide growth step.

12. The process of claim 9 wherein the thickness of the thinned and polished wafer is at least about 30 micrometers thinner than the thickness of the wafer prior to the oxide growth step.

13. The process of claim 1 wherein, prior to said oxidation step, the wafer contained oxygen precipitate nucleation centers between the central plane and the precipitate free zone.

14. The process of claim 1 wherein the wafer further comprises a first axially symmetric region which is substantially free of agglomerated intrinsic point defects.

15. The process of claim 14 wherein the first axially symmetric region is a region in which vacancies are the predominant intrinsic point defect.

16. The process of claim 15 wherein the wafer further comprises a second axially symmetric region in which silicon self-interstitial atoms are the predominant intrinsic point defect and which is substantially free of agglomerated silicon self-interstitial intrinsic point defects.

17. The process of claim 1 wherein the polished wafer is used as a monitor wafer in at least one step of a semiconductor device fabrication process.

18. The process of claim 1 wherein a semiconductor device is formed in the device layer of the polished wafer.

19. The process of claim 1 wherein prior to step (a), the wafer has a non-uniform distribution of crystal lattice vacancies with the peak concentration of vacancies being at a maximum at a distance of at least 20 micrometers from the front surface of the wafer.

20. The process of claim 1 wherein prior to step (a), the wafer has a non-uniform distribution of crystal lattice vacancies with the peak concentration of vacancies being at a maximum at a distance of at least 30 micrometers from the front surface of the wafer.

21. The process of claim 1 wherein prior to step (a), the wafer has a non-uniform distribution of crystal lattice vacancies with the peak concentration of vacancies being at a maximum at a distance of at least 40 micrometers from the front surface of the wafer.

22. The process of claim 1 wherein prior to step (a), the wafer has a non-uniform distribution of crystal lattice vacancies with the peak concentration of vacancies being at a maximum at a distance of at least 50 micrometers from the front surface of the wafer.

23. The process of claim 1 wherein the wafer has a concentration of oxygen which is less than 9 PPMA.

24. The process of claim 1 wherein the wafer has a concentration of oxygen which is less than 8 PPMA.

25. The process of claim 1 wherein an oxide layer having a thickness of at least 3 nanometers is grown on the front surface of the wafer in step (a).

26. The process of claim 1 wherein an oxide layer having a thickness of at least 25 nanometers is grown on the front surface of the wafer in step (a).

27. The process of claim 1 wherein an oxide layer having a thickness of at least 50 nanometers is grown on the front surface of the wafer in step (a).

* * * * *

UNITED STATES PATENT AND TRADEMARK OFFICE
CERTIFICATE OF CORRECTION

PATENT NO. : 7,008,874 B2  Page 1 of 1
APPLICATION NO. : 10/022967
DATED : March 7, 2006
INVENTOR(S) : Robert J. Falster It is certified that error appears in the above-identified patent and that said Letters Patent is hereby corrected as shown below:

On the Title Page of the Patent
(73) Assignee: "MEMC Electronics Materials, Inc." should read -- MEMC Electronic Materials, Inc. --.

Signed and Sealed this

Twenty-eighth Day of August, 2007

JON W. DUDAS
*Director of the United States Patent and Trademark Office*